United States Patent

Namikawa et al.

Patent Number: 5,707,441
Date of Patent: Jan. 13, 1998

[54] METHOD FOR PREPARING AN OXIDE CRYSTAL

[75] Inventors: Yasuo Namikawa; Yuh Shiohara; Shoji Tanaka, all of Tokyo, Japan

[73] Assignees: Sumitomo Electric Industries, Ltd.; International Superconductivity Technology Center, both of Japan

[21] Appl. No.: 569,895

[22] Filed: Dec. 8, 1995

[30] Foreign Application Priority Data

Dec. 28, 1994 [JP] Japan .................. 6-327021

[51] Int. Cl.$^6$ .................. C30B 15/20
[52] U.S. Cl. .................. 117/14; 117/15; 117/201
[58] Field of Search .................. 117/13, 14, 15, 117/201, 937

[56] References Cited

U.S. PATENT DOCUMENTS

| | | | |
|---|---|---|---|
| 5,240,684 | 8/1993 | Baba et al. | 117/14 |
| 5,485,803 | 1/1996 | Habu | 117/14 |

FOREIGN PATENT DOCUMENTS

0450502A1  10/1991  Japan .................. 117/14

OTHER PUBLICATIONS

K. Watanabe, "An approach to the growth of $YBa_2Cu_3O_{7-x}$ single crystals by the flux method. II", Journal of Crystal Growth, 1991, vol. 114, pp. 269–278.

Elizabeth et al., "Growth and extraction of flux free YBCO crystals", Journal of Crystal Growth, 1992, vol. 121, pp. 531–535.

Yamada et al., "Continuous Crystal Growth of Y123 by the Modified Top–Seeded Solution Growth" and related articles, 54th Oyo Butsuri Gakkai Gakujutsu Koenkai, 1993, 29-p-ZK-7.

Yamada et al., "Continuous crystal growth of $YBa_2Cu_3O_{7-x}$ by the modified top–seeded crystal pulling method", Physica, C 217, 1993, pp. 182–188.

Goriletsky et al., "Automated Pulling of Large Alkali Halide Single Crystals", Journal of Crystal Growth (1981) 509–513, from Proceedings of the Sixth International Conference on Crystal Growth, Moscow, USSR, Sep. 10–16, 1980.

Eidelman et al., "Automated Growing of Large Single Crystals Controlled by Melt Level Sensor", Crystal Research and Technology vol. 20 No. 2 (1985) 167–172, East Germany.

Sen et al., "Creep of CuO–BaO Melts Along the Container Wall", Materials Letters, vol. 7 No. 12 (Mar. 1989) 433–436.

Primary Examiner—Felisa Garrett
Attorney, Agent, or Firm—Pennie & Edmonds LLP

[57] ABSTRACT

In order to prepare a large yttrium or lanthanoid based oxide superconductor crystal of higher quality, a method and an apparatus which can stably control the shape of a pulled crystal and stably maintain growth of the crystal from a melt are provided. A crystal of an oxide having a structure of $RBa_2Cu_3O_{7-x}$ (R: yttrium or lanthanoid element, $0 \leq X \leq 1$) is pulled from a raw material melt which is stored in a crucible by a rotary crystal pulling shaft. During such pulling, a position of the surface of the raw material melt is measured with time to obtain a lowering speed of the surface in a direction substantially parallel to the crystal pulling direction, for adjusting the lifting speed of the crystal pulling shaft by this lowering speed.

5 Claims, 5 Drawing Sheets

METHOD FOR PREPARING AN OXIDE CRYSTAL

BACKGROUND OF THE INVENTION

1. Field of the Invention

The present invention relates to a method of and an apparatus for preparing an oxide crystal, and more particularly, it relates to a method of and an apparatus for preparing a crystal of a yttrium or lanthanoid element based oxide superconductor.

2. Description of the Background Art

A Y based oxide superconductor ($YBa_2Cu_3O_{7-x}$ ($0 \leq X \leq 1$), hereinafter referred to as Y123) is watched with interest as a high temperature superconducting material having a critical temperature of 90K. In order to prepare a superconducting electronic device from this material, establishment of a technique of preparing a large single crystal substrate is desired. However, it is considerably difficult to obtain a large single crystal of Y123, since a Y123 crystal is grown by peritectic solidification reaction, and reactivity of a BaO—CuO melt serving as a flux is so high that the same is hard to hold in a crucible.

In general, a flux method is suitable for preparing a crystal by peritectic solidification reaction. Also in preparation of a Y123 crystal, therefore, crystal growth by the flux method has generally been attempted with a crucible of alumina or platinum and a flux of a BaO—CuO melt. In the flux method, however, it is considerably difficult to stably prepare a large crystal since nucleation in the melt cannot be controlled and a number of crystal nuclei are formed. It is also disadvantageous that the reactivity of the BaO—CuO melt is so high that the same is hard to hold in a crucible, as described above (refer to J. Crystal Growth 114, 1991, p. 269, K. Watanabe; J. Crystal Growth 121, 1992, p. 531, S. Elizabeth et al.).

On the other hand, a pulling method which is employed for preparing a large single crystal of semiconductors such as Si and GaAs is suitable for preparing a large single crystal from a melt in excellent controllability. However, it is difficult to apply the pulling method to preparation of a Y123 crystal due to the aforementioned problems of peritectic solidification and reactivity of the melt.

Yamada et al. have succeeded in continuously growing a single crystal of Y123 by the pulling method, by employing a yttria crucible and making a $Y_2BaCuO_5$ phase coexist with a melt as a supply source for a solute (refer to 54-th Oyo Butsuri Gakkai Gakujutsu Koenkai, 1993, 29pZK-7, Y. Yamada and Y. Shiohara; Physica C. 217, 1993, P. 182, Y. Yamada and Y. Shiohara.

When a Y123 single crystal is grown by the pulling method, however, holding of the BaO—CuO melt in a crucible first comes into question as described above, leading to difficulty in selection of the material for the crucible. When the melt is held in a crucible of a noble metal such as platinum over a long time, holes may be made in the crucible to disable its usability. In a general fire-resistant ceramics crucible, on the other hand, the melt may exude, or creep up along the crucible and overflow the same, to be extremely reduced in volume. Thus, it has been an important subject to find a crucible which can stably hold the melt.

Yamada et al. have succeeded in growing a Y123 single crystal through the pulling method, by employing a crucible of a $Y_2O_3$ (yttria) sintered body and stably holding the melt to some extent (refer to the aforementioned literature). Thus, it has been made possible to grow a crystal by the pulling method with no contamination of impurities. However, the melt cannot be completely suppressed from overflowing the crucible. Also in the case of this crucible, the melt gradually creeps up along the side wall thereof, and its level is lowered.

When a crystal is grown over a long time, the speed of lowering of the melt level is increased. When the melt level is thus lowered in pulling of the crystal, it is difficult to balance the crystal growth rate and the crystal pulling speed in the conventional method, and hence the crystal may be separated from the melt surface during the pulling. In the conventional method, therefore, it is difficult to stably control the shape of the crystal as pulled, as well as to stably continue the crystal growth over a long time.

SUMMARY OF THE INVENTION

In order to solve the aforementioned problems of the prior art, an object of the present invention is to provide a method of and an apparatus for preparing an oxide crystal, which can stably control the shape of a pulled crystal as well as stably continue crystal growth from a raw material melt, for preparing a large yttrium or lanthanoids based oxide crystal of higher quality.

The method of preparing an oxide crystal according to the present invention comprises, in a method of pulling an oxide crystal having a structure of $RBa_2Cu_3O_{7-x}$ (R: yttrium or lanthanoid element, $0 \leq X \leq 1$) from a raw material melt which is stored in a crucible by a rotary crystal pulling shaft, the step of measuring the surface positions of the raw material melt with time during pulling of the crystal to obtain the movement speed of the surface of the raw material melt in a direction substantially parallel to the crystal pulling direction, and adjusting the lifting speed of the crystal pulling shaft by the movement speed.

In the method according to the present invention, a target value (V) of the crystal pulling speed can be so set as to balance the crystal growth rate and the crystal pulling speed. After the movement speed (M) of the surface of the raw material melt is obtained, the lifting speed (P) of the crystal pulling shaft can be set in accordance with an equation of $P=V-M$.

In the method according to the present invention, the movement speed of the raw material melt surface can be determined as follows, for example: In this method, an electrically conductive material which can stably maintain its shape upon contact with the raw material melt is provided to be upwardly and downwardly movable. Further, means for measuring an electric change which is caused when the conductive material is brought into contact with the raw material melt is so provided that the conductive material is connected to this means. Thus, the surface position ($Z_0$) of the raw material melt is detected from the electric change which is caused when the conductive material is downwardly moved from a prescribed position and brought into contact with the raw material melt in crystal pulling. The conductive material which is brought into contact with the raw material melt is then upwardly moved and separated from the raw material melt, and then downwardly moved again after a lapse of a prescribed time (T) from the detection of $Z_0$ and brought into contact with the raw material melt, so that the current position ($Z_1$) of the raw material melt surface is detected. Thus, ($Z_0-Z_1$)/T can be obtained as the movement speed of the raw material melt surface.

The means for measuring the electric change which is caused when the conductive material is brought into contact with the raw material melt can comprise an electric resistance measuring device, for example. The conductive material is so connected to the electric resistance measuring device that the position of the raw material surface can be detected from a change in its electric resistance value which is caused when the same comes into contact with the raw material melt.

The apparatus for preparing an oxide crystal according to the present invention comprises a crucible for storing a raw material melt, heating means for maintaining the raw material melt which is stored in the crucible at a prescribed temperature, a crystal pulling shaft which is vertically movably provided in a rotatable manner for pulling a crystal from the raw material melt stored in the crucible, means for measuring the surface position of the raw material melt which is stored in the crucible with time during pulling of the crystal, means for obtaining the movement speed of the melt surface in a direction substantially parallel to the pulling direction from the surface positions measured with time, and means for controlling the lifting speed of the crystal pulling shaft from the movement speed.

In the apparatus according to the present invention, the means for measuring the surface position of the raw material melt with time can comprise an electrically conductive material which can stably maintain its shape upon contact with the raw material melt, means which can be periodically upwardly and downwardly moved while holding the conductive material in a position above the crucible, means which is electrically connected with the conductive material for measuring an electric change caused when the conductive material is brought into contact with the raw material melt stored in the crucible, and means for determining the surface position of the raw material melt in response to the electric change, for example.

In such an apparatus, further, the means for measuring an electric change can comprise an electric resistance measuring device. The conductive material is so connected to the electric resistance measuring device that the position of the raw material melt surface can be determined from a change in its electric resistance value caused when the same comes into contact with the raw material melt.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
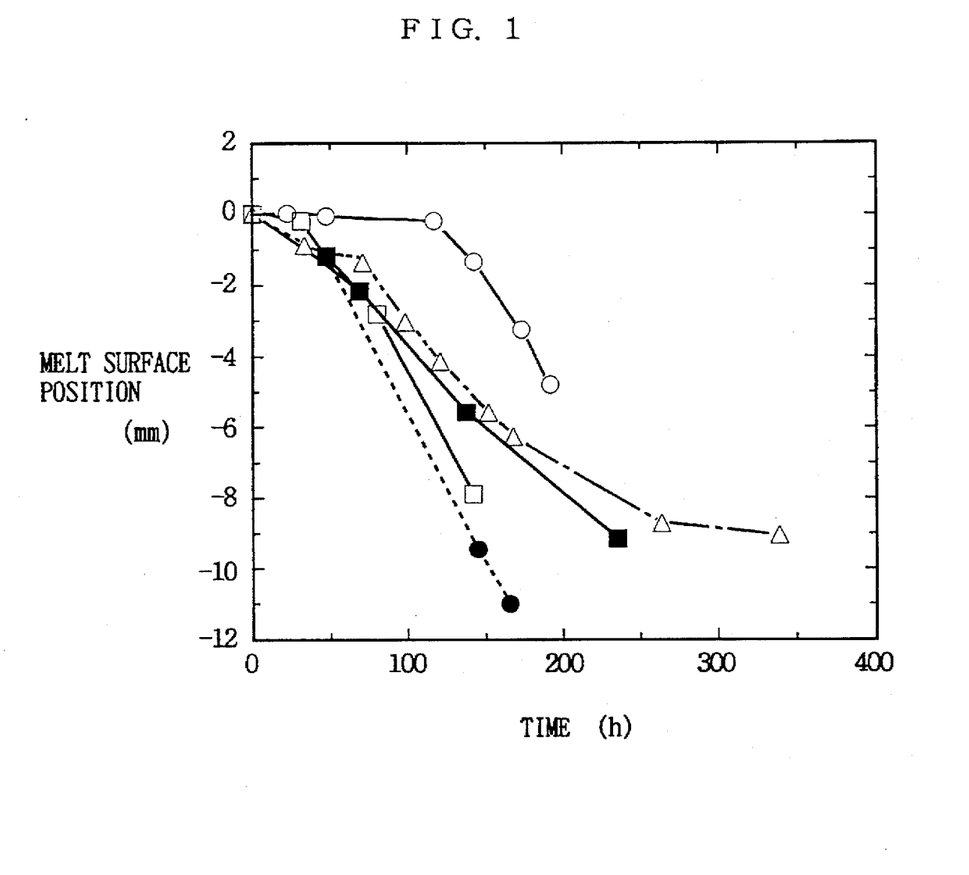
FIG. 1 illustrates the results of measurement of time changes of the surface positions of the melts held in various crucibles.

FIG. 1 illustrates how positions of the melt surfaces are changed with time when the melts for preparing Y123 crystals are held in various crucibles. This figure shows time changes of surface positions of the melts which are held in five double crucibles, each formed by combination of an inner crucible consisting of a yttria sintered body and an outer crucible consisting of a magnesia sintered body. As clearly understood from FIG. 1, the melts react with the inner crucibles and overflow the same, such that the surface levels thereof are gradually lowered. In specific ones of the crucibles, the lowering speeds of the melts are changed with time. Further, the states of lowering of the melts are considerably varied with the crucibles. This is because the crucibles are formed by sintered bodies, and it is difficult to completely maintain the same at constant quality levels.

On the other hand, it is extremely important to control the crystal pulling speed (V) in the pulling method. First, it is necessary to balance V with the crystal growth rate (G). Namely, the following equation is the necessary condition:

$$V = G \quad (1)$$

If $V > G$, the crystal growth cannot follow the crystal pulling, and the growth cannot be continued since the crystal is separated from the melt surface. Further, it is an extremely important technique to control the shape of the crystal, in both of study and industrial levels. The shape is mainly controlled by estimating the crystal diameter (D) from a weight change ($\Delta W$) of the pulled crystal and the crystal growth rate (G). If G is sufficiently high, surface tension of a meniscus part and buoyancy which is applied to a portion of the crystal located under the free face of the melt are negligible, and the crucible is so sufficiently large that lowering of the melt surface following the crystal growth is negligible, the sectional shape of the crystal can be circularized so that the crystal diameter (D) is obtained along the following equation:

$$D = 2 \times (\Delta W / \pi d G \Delta t)^{1/2} \quad (2)$$

where d and $\Delta t$ represent the crystal density and the time bringing the weight change respectively.

The lifting speed (P) of the pulling shaft can be readily mechanically measured, and hence the crystal pulling speed V can be recognized from the lifting speed P if the melt is stable. Namely, $V = P$. When the melt surface is lowered at a speed M, however, the substantial crystal pulling speed is obtained as follows:

$$V = P + M \quad (3)$$

Therefore, the crystal pulling speed V cannot be recognized unless the melt lowering speed M is clarified. When the pulling speed is by far larger than the melt surface lowering speed ($P \gg M$), M can be neglected. When the pulling speed and the melt lowering speed are close to each other, however, it is inevitably necessary to measure M, in order to obtain V. If V is unknown, V cannot be controlled to be balanced with G along the equation 1 but the crystal may disadvantageously be separated from the melt surface. Since there is no means for directly measuring G of the equation 2, D is basically estimated from V assuming that the equation 1 holds. However, such estimation is impossible if V is unknown, and the crystal shape cannot be controlled.

The growth rate G of a Y123 crystal, which is grown from a flux, is at an extremely small value of not more than 0.2 mm/h. at the most. In order to balance the lifting speed P with G, therefore, it is necessary to set P at a level of not more than 0.2 mm/h. On the other hand, the melt lowering speed, which is varied with the conditions, is 0 to 0.2 mm/h., as shown in FIG. 1. Therefore, M is substantially at the same level as P, and V cannot be estimated from P alone. In order to stably continue the crystal growth and further to control the crystal shape, it is inevitably necessary to know M. However, M, which is extremely varied with the crucible or the crystal growth conditions as described above, cannot be simply estimated.

To this end, the inventors have measured the position of the surface of the raw material melt with time during crystal pulling to obtain the movement speed (lowering speed) of the surface, thereby adjusting the lifting speed for the crystal pulling shaft in response to the speed. Due to this method, it is possible to set the crystal pulling speed in response to the movement speed of the melt surface, thereby controlling the crystal shape and stably pulling the crystal in preparation of a yttrium or lanthanoid element based oxide crystal.

According to the present invention, automatic measurement of the surface position of the raw material melt can be attained by various methods and means. When an electrically conductive material is provided to be upwardly and downwardly movable with respect to the raw material melt and an electric change which is caused when the conductive material is downwardly moved and brought into contact with the raw material melt is measured, for example, the surface position of the raw material melt can be automatically detected. This method is suitable for automatic control. A change of an electric resistance value, for example, is preferably employed as the electric change. A system of measuring the position of the melt surface is now described in more concrete terms.

When a crystal having a structure of $RBa_2Cu_3O_{7-x}$ (R: yttrium or lanthanoid element, $0 \leq X \leq 1$) is pulled, the raw material is a mixture of oxides of R, Ba and Cu. This raw material is melted by heating, and a crystal is pulled from the surface of the melt. An oxide crystal is originally an insulator having extremely high electric resistance, while electric resistance of the raw material melt therefor is considerably low since the elements forming the same are electrolytically dissociated into positive and negative ions.

Therefore, two or a pair of conductors which are electrically open or provided with prescribed high electric resistance across the same are provided to be upwardly and downwardly movable. Then, these conductors are downwardly moved from above the melt, while measuring the electric resistance across the same. When the two conductors simultaneously come into contact with the melt surface, the same are electrically connected with each other by the melt, whereby the electric resistance across these conductors is remarkably reduced. Thus, the position of the melt surface can be measured in high accuracy. Alternatively, one of the two conductors may previously be in contact with the melt. In this case, the electric resistance is remarkably reduced when the other conductor is downwardly moved and brought into contact with the melt, to show the position of the melt surface.

Further alternatively, one of the two conductors may be connected with a crucible storing the melt, the pulled crystal, or a seed crystal, in place of being directly brought into contact with the melt. The remaining conductor is downwardly moved to be brought into contact with the melt. Similar measurement can be made through a change between the two conductors, i.e., the resistance change caused when the remaining conductor comes into contact with the melt, also by this system, although sensitivity is reduced.

Thus, a position $Z_0$ of the melt surface at a time $t_0$ is obtained. The conductors which are brought into the melt are then upwardly moved and separated from the melt. After a lapse of a prescribed time, the conductors are automatically downwardly moved again and brought into contact with the melt surface, so that a position $Z_1$ of the melt surface at a time $t_1$ is measured similarly to the above. When the melt surface is gradually lowered, the lowering speed thereof is calculated in accordance with $(Z_0-Z_1)/(t_1-t_0)$. The lowering speed of the melt surface can be periodically obtained by periodically repeating the aforementioned operation.

Assuming that M represents the lowering speed, the substantial crystal pulling speed V can be obtained in accordance with P+M, as described above. Therefore, when the crystal growth rate G is obtained from data from a load cell which is mounted on the crystal pulling shaft, for example, P (the lifting speed of the pulling shaft) can be re-set in order to balance G with V. Namely, P can be adjusted by automatic control, in response to M as measured. Thus, G and V are so balanced with each other that the shape of the pulled crystal is controlled in response to movement of the melt surface. While the pulled crystal is composed of a shoulder portion up to a constant diameter from starting of pulling from the seed crystal, a body portion having a continuous constant diameter, and a rear end portion whose diameter is reduced toward termination, it is also desirable to set the crystal pulling speed in response to each of these portions.

In the aforementioned position measurement of the melt surface, at least one material selected from the group consisting of platinum, rhodium, iridium, gold and alloys of these elements can be employed for the conductors which are brought into contact with the melt. While the conductors can be provided in various shapes, the same can be in linear or plate shapes, for example.

However, it is necessary to prevent the conductors from being brought into contact with the melt portion which is extremely close to the grown crystal or to avoid employment of conductors whose thermal capacitances are so high that the same exert remarkable influences on thermal environment around the grown crystal, in order to protect the crystal growth against bad influences. Therefore, the conductors are preferably brought into contact with the melt surface in positions separated from the crucible center by distances of at least ¼ the inner diameter of the crucible. When the conductors are provided in linear or plate shapes, the maximum diameters or the maximum widths of these conductors are preferably not more than ¹⁄₂₀ the inner diameter of the crucible.

The upwardly and downwardly movable conductors can be formed by a thermocouple. In this case, the temperature of the melt can also be measured simultaneously with measurement of the electric resistance. When two or a pair of conductors are employed, the same may form positive and negative poles of the thermocouple respectively.

The melt lowering speed can be accurately measured by the aforementioned means, without exerting a bad influence on the crystal growth. Thus, V can be known also in growth of the oxide crystal in which V cannot be estimated from P alone. Thus, the crystal growth can be stably continued while balancing V and G with each other, and the crystal diameter D can be controlled on the basis of V. According to the method and the apparatus of the present invention, it is possible to prepare a large oxide crystal of high quality whose crystal shape is accurately controlled.

According to the present invention, the crucible can consist essentially of an oxide sintered body of R. Further, the crucible directly storing the raw material melt can be stored in an outer crucible consisting essentially of MgO (magnesia) sintered body. When the crucibles consisting essentially of the R oxide and the magnesia sintered body are employed as inner and outer crucibles respectively, it is possible to grow the crystal while holding the melt by the inner crucible without contaminating the same with Mg and suppressing overflowing of the melt by the outer crucible.

According to the present invention, the crucible is more preferably held on a support pole consisting essentially of an MgO (magnesia) single crystal. When the aforementioned double crucible structure is employed, the outer crucible is more preferably held on the support pole consisting essentially of a magnesia single crystal.

According to the present invention, heating/melting of the raw material, holding of the melt and preparation of the oxide crystal can be carried out under an atmosphere containing vapor of a material which is selected from the group consisting of silver, a silver alloy and a silver compound. Vapor of such material, particularly that of silver suppresses the movement (downward movement) of the level of the melt and dissolution of the crucible components into the melt.

The present invention can be applied to preparation of an oxide crystal having a structure of $YBa_2Cu_3O_{7-x}$ ($0 \leq X \leq 1$). In this case, the raw material melt can be composed of a mixture of $Y_2BaCuO_5$, BaO and CuO. Further, the present invention is applied to preparation of an oxide crystal having a structure of $SmBa_2Cu_3O_{7-x}$ ($0 \leq X \leq 1$). In this case, the raw material melt can be composed of a mixture of $Sm_2BaCuO_5$, BaO and CuO. In addition, the present invention is applied to preparation of an oxide crystal having a structure of $PrBa_2Cu_3O_{7-x}$ ($0 \leq X \leq 1$). In this case, the raw material melt can be composed of a mixture of $PrBaO_3$, BaO and CuO.

EXAMPLES

Examples of the method according to the present invention are now described with reference to the drawings.

Example 1

Figure 2:
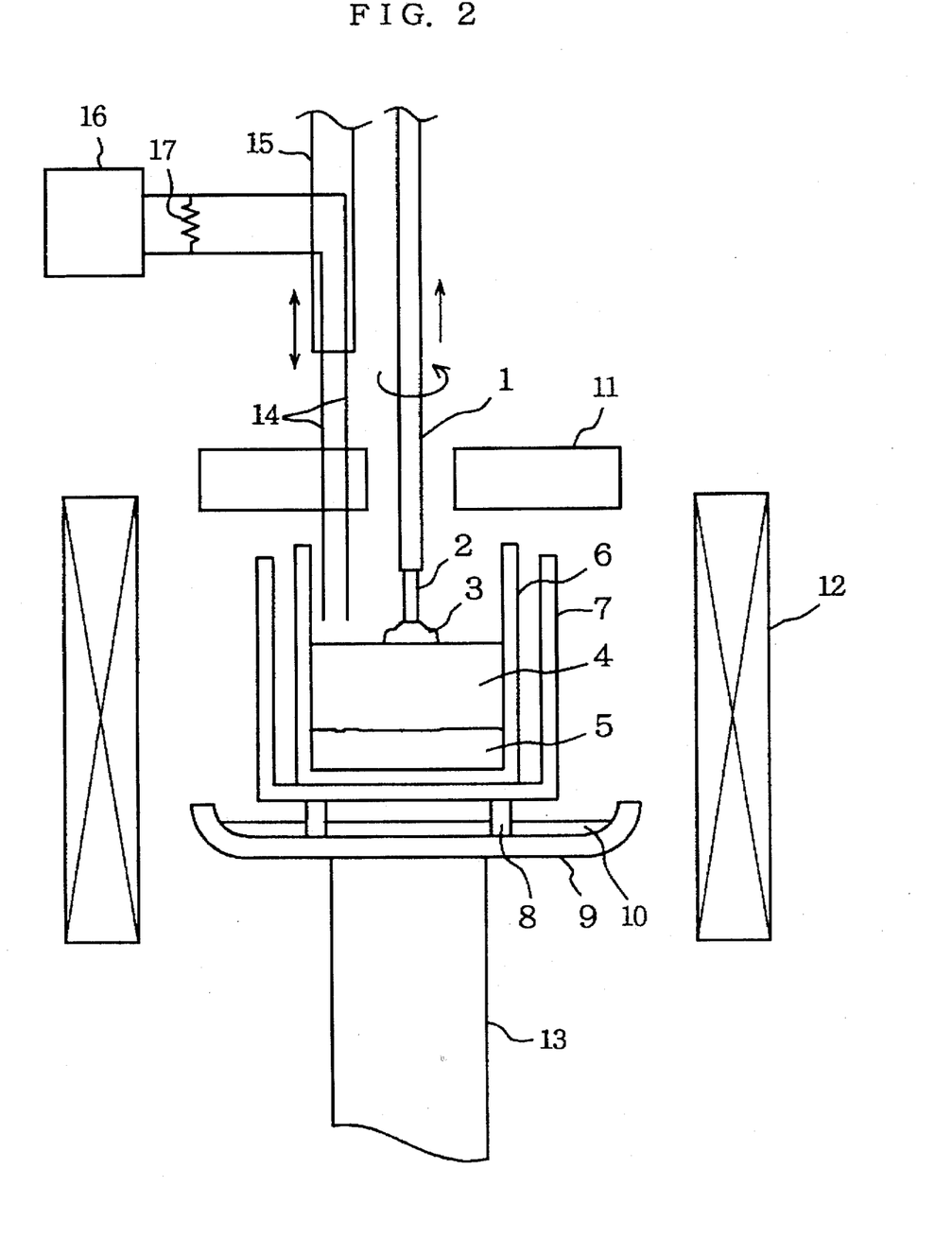
FIG. 2 is a model diagram of an apparatus employed for pulling a Y123 crystal in Example 1.

FIG. 2 is a model diagram showing an exemplary apparatus which is employed for the crystal pulling method according to the present invention. Referring to FIG. 2, a double crucible is provided at the center of the apparatus. The double crucible is formed by an inner crucible 6 consisting of a $Y_2O_3$ sintered body, and an outer crucible 7 consisting of an MgO sintered body. The outer crucible 7 is supported by a support pole 8 consisting of an MgO single crystal, which is placed on an $Al_2O_3$ plate 9. The $Al_2O_3$ plate 9 is provided on a support 13 consisting of a heat insulator. This $Al_2O_3$ plate 9 stores a melt 10 of Ag. An electric heater 12 is provided around the outer crucible 7, thereby maintaining the melt at a prescribed temperature. Another heat insulator 11 is provided also above the double crucible. In this apparatus, a pulling shaft 1 which is vertically movable in a rotatable manner is provided at the center to pull up a crystal 3 from the melt which is stored in the inner crucible 6. In crystal pulling, a seed crystal 2, consisting of an MgO single crystal, which is provided on the forward end of the pulling shaft 1 is brought into contact with the melt, and then the pulling shaft 1 is rotated to pull up the crystal 3. The melt can be prepared from a solid phase deposit 5 ($Y_2BaCuO_5$ in the case of pulling a Y123 crystal (hereinafter referred to as Y211)), which is a supply source of an element R, and a flux 4 (BaO—CuO melt).

This apparatus is further provided with a counter shaft 15 which can be upwardly and downwardly moved independently of the movement of the crystal pulling shaft 1. The counter shaft 15 is provided with two platinum wires 14 at a prescribed space, and these platinum wires 14 can be moved following movement of the counter shaft 15. The two platinum wires 14 are connected to respective terminals of a resistance meter 16. Further, a resistance 17 is so provided as to set the resistance across the two platinum wires 14 at a prescribed value. In such a mechanism, the resistance meter 16 measures the resistance across the two platinum wires 14. When the counter shaft 15 is downwardly moved and the two platinum wires 14 come into contact with the surface of the melt, the resistance value across the two platinum wires is abruptly reduced. The resistance meter monitors this change, thereby detecting the position of the surface of the melt. Then, the platinum wires are upwardly moved and separated from the melt. After a lapse of a prescribed time, the platinum wires are again downwardly moved, so that the position of the surface of the melt is detected similarly to the above. A computer (not shown) divides the difference between the positions of the surface of the melt obtained with time through the aforementioned steps by the elapsed time, thereby calculating the movement speed (lowering speed) of the melt surface. On the basis of the calculated data, a conventional control mechanism (not shown) adjusts the lifting speed of the pulling shaft 1. The conventional control mechanism includes a step motor for example. The pulling shaft 1 is driven by the step motor of which the moving speed is controlled in response to the signal from the computer.

In Example 1, a Y123 crystal was prepared in the following procedure: First, $Y_2BaCuO_5$ (hereinafter referred to as Y211) was introduced into the bottom portion of the inner crucible 6 consisting of a $Y_2O_3$ sintered body of 50 mm in inner diameter, 60 mm in outer diameter and 45 mm in depth. Then, a substance prepared by mixing barium carbonate and copper oxide with each other so that the molar ratio of Ba to Cu was 3:5 and temporarily sintering the mixture at 880° C. for 40 hours was introduced on Y211 as a raw material for the flux 4 (BaO—CuO melt). Then, the inner crucible 6 was introduced into the outer crucible 7 consisting of an MgO sintered body of 65 mm in inner diameter, 75 mm in outer diameter and 45 mm in depth. The crucible support pole 8 consisting of an MgO single crystal was set up on the $Al_2O_3$ plate 9, which in turn stored Ag 10. The outer crucible 7 was placed on the support pole 8.

These were set in a furnace, and heated to about 1000° C. by the heater 12, to melt the raw material in the inner crucible. At this time, Ag 10 was sufficiently melted to form an Ag atmosphere around the crucible. On the other hand, Y211 formed a solid phase deposit on the bottom of the inner crucible 6, while Y, Ba and Cu in the melt were at molar ratios of about 1:60:100 since Y was gradually dissolved into the flux 4 from Y211. Y was supplied from the solid phase of Y211 to the melt also during the crystal growth.

The surface temperature of the melt 4 was maintained at about 980° C. to 1010° C., and the pulling shaft 1 which was provided with the seed crystal 2 on its lower end was rotated at 120 rpm and slowly downwardly moved so that the lower end of the seed crystal 2 was brought into contact with the melt surface, for starting crystal growth.

Holding of the melt in this state is now described. Since the inner crucible is made of yttria, the melt is contaminated with no impurities. The melt reacts with the yttria crucible and creeps up along its wall, while overflowing of this melt can be considerably reduced by employing an atmosphere of silver vapor. A part of the melt overflowing the inner crucible comes into contact with the outer crucible consisting of magnesia, while this part will not creep up along the outer crucible to overflow the same, since magnesia is substantially unreactive with the melt. However, it is impossible to completely prevent the melt from penetrating into grain boundaries of the sintered body forming the magnesia outer crucible. Therefore, the position of the melt surface is gradually lowered. The lowering speed is 0 to 0.2 mm/h., depending on the crucible and crystal growth conditions.

While a small crystal can be pulled up in this state, it is necessary to recognize the melt surface lowering speed M, in order to prepare a large single crystal having a controlled shape by stabilizing the crystal growth over a long time. In Example 1, M was measured in the following procedure:

The counter shaft 15 was slowly downwardly moved while measuring the resistance across the platinum wires 14 by the resistance meter 16. The platinum wires 14 of 0.5 mm$\phi$ were provided at a space of 8 mm, on the positions which were separated from the crucible center by 18 mm. It was possible to measure the vertical position of the counter shaft 15, which was capable of being vertically moved at a constant speed, in dissolution of 0.1 mm. The value of the resistance 17 was 5 M$\Omega$. Since the resistance across the platinum wires 14 before connection of the resistance 17 was in excess of 10 M$\Omega$, the value measured by the resistance meter 16 exhibited the value 5 M$\Omega$ of the resistance 17. When both of the platinum wires 14 were brought into contact with the surface of the melt, the measured resistance was reduced to 0.5 to 5 K$\Omega$ at a stretch. The current position $Z_0$ of the counter shaft 15 was recorded, and then the counter shaft 15 was pulled up to a prescribed height. After a lapse of a constant time T, a position $Z_1$ of the counter shaft 15 corresponding to the current melt surface position was recorded by a similar operation. The average melt surface lowering speed M was obtained by the following equation:

$$M=(Z_0-Z_1)/T \tag{4}$$

Figure 3:
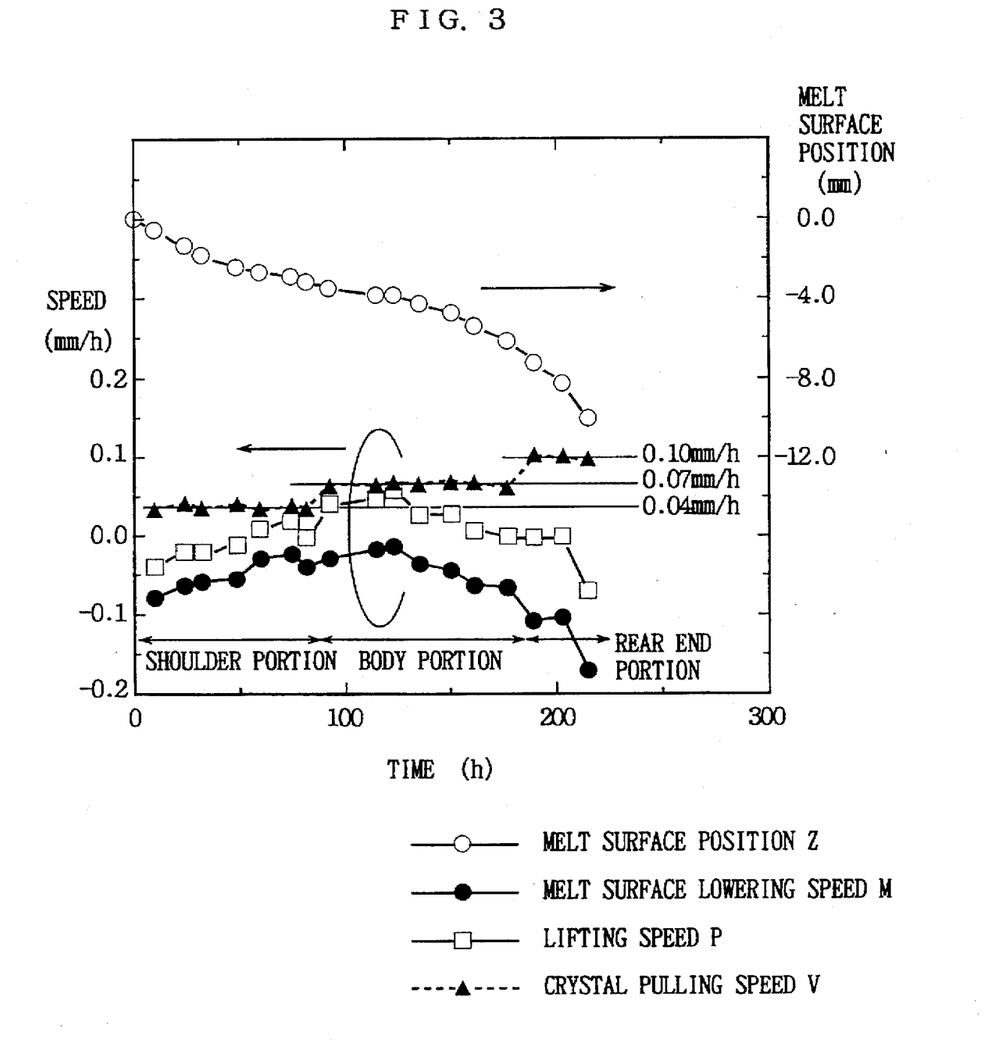
FIG. 3 shows time changes of the liquid surface lowering speed M obtained in pulling of a Y123 crystal, and the shaft lifting speed P and the crystal pulling speed V adjusted on the basis thereof in Example 1.

FIG. 3 shows the results of values Z and M obtained by repeating such measurement of the melt surface position every 10 to 15 hours. The lowering speed was gradually quickened from 0.015 mm/h. to 0.040 mm/h.

The crystal pulling speed V is provided by the equation 3, as described above. Thus, it is necessary to control the lifting speed P on the basis of the measured value of the melt surface lowering speed M, so that the crystal pulling speed V reaches a target value:

$$P=V-M \tag{5}$$

In order to balance V with G and to control the crystal shape, target values of V were set as follows:

V=0.04±0.005 mm/h. (shoulder portion of the pulled crystal)
V=0.07±0.005 mm/h. (body portion of the pulled crystal)
V=0.10±0.005 mm/h. (rear end portion of the pulled crystal)

FIG. 3 also shows time changes of P and V respectively.

The crystal rotational frequency was at a constant level of 120 rpm. A load cell (not shown) was mounted on the upper end of the pulling shaft 1, to also refer to a signal related to the crystal weight, which was obtained from the load cell, as to whether the crystal pulling speed V was balanced with the crystal growth rate G.

Through the aforementioned process, it was possible to grow a shape-controlled Y123 crystal having a shoulder portion of 3 mm in length, a body portion of 10 mm square and 6 mm in length, and a rear end portion of 3 mm in length.

Example 2

A method for preparing an oxide crystal of $SmBa_2Cu_3O_{7-x}$ ($0 \leq X \leq 1$) (hereinafter referred to as Sm123) is now described.

Figure 4:
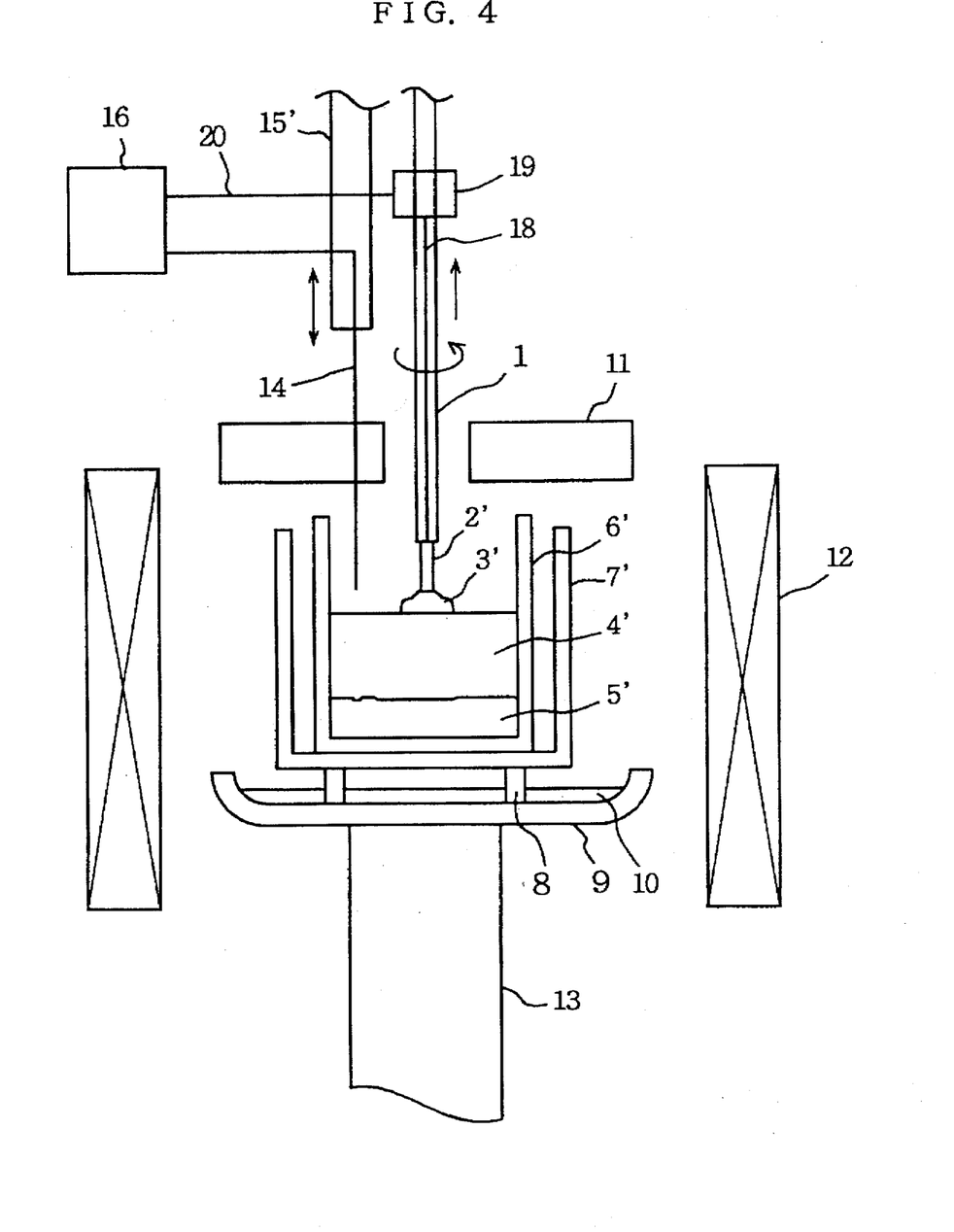
FIG. 4 is a model diagram of an apparatus employed for pulling an Sm123 crystal in Example 2.

FIG. 4 is a model diagram of an apparatus employed for pulling the Sm123 crystal. This apparatus is similar in mechanism to that of Example 1, except the following points: In this apparatus, a platinum wire 18 which is additional to a single platinum wire 14 is in close contact with a seed crystal 2'. The platinum wire 18 passes through a pulling shaft 1, to be connected with a slip ring 19. The slip ring 19 is connected with a resistance meter 16 by a lead wire 20. An output from the platinum wire 18 is taken out by the lead wire 20 through the slip ring 19, and input in the resistance meter 16. The platinum wire 14 is fixed not to the counter shaft but to a manual Z stage 15'. An inner crucible 6' consists of an $Sm_2O_3$ sintered body. A solid phase deposit 5' forming a raw material melt is made of $Sm_2BaCuO_5$ (hereinafter referred to as $Sm_{211}$). An Sm123 crystal 3' is pulled from the raw material melt.

According to Example 2, an Sm123 crystal was prepared in the following procedure: First, Sm211 was introduced into the bottom of the inner crucible 6' consisting of an $Sm_2O_3$ sintered body of 50 mm in inner diameter, 60 mm in outer diameter and 45 mm in depth. A substance prepared by mixing barium carbonate and copper oxide so that Ba and Cu were in a molar ratio of 3:5 and temporarily sintering the mixture at 880° C. for 40 hours was introduced on Sm211 as a raw material for a BaO—CuO melt 4'. Then, the inner crucible was introduced into an outer crucible 7' consisting of an MgO sintered body of 65 mm in inner diameter, 75 mm in outer diameter and 45 mm in depth. A crucible support pole 8 consisting of an MgO single crystal was set up on an $Al_2O_3$ plate 9, Ag 10 was introduced into the plate 9, and the outer crucible 7' was placed on the support pole.

These were set in a furnace, and heated to about 1060° C. by a heater 12, to melt the raw material stored in the inner crucible. At this time, Ag 10 was sufficiently melted to form an Ag atmosphere around the crucible. On the other hand, Sm211 formed a solid phase deposit on the bottom of the inner crucible 6', while Sm, Ba and Cu in the melt were at molar ratios of about 1:24:40 since Sm was gradually dissolved into the melt 4' from Sm211.

Then, the surface temperature of the melt 4' was maintained at 1040° C. to 1055° C., and the pulling shaft 1 which was provided with the seed crystal 2' on its lower end was rotated at 100 rpm and slowly downwardly moved so that the lower end of the seed crystal 2' was brought into contact with the melt surface.

The Z stage 15' was slowly downwardly moved while measuring the resistance across the platinum wires 14 and 18 with the resistance meter 16. At this time, the measured resistance value exhibited about 10 M$\Omega$. When the platinum wire 14 came into contact with the surface of the melt 4', the measured resistance was reduced to 200 to 500 k$\Omega$. The current position $Z_0$ of the Z stage 15' was recorded, and then the Z stage 15' was lifted up to a prescribed height. After a lapse of a constant time T, a position $Z_1$ of the Z stage 15' corresponding to the current surface position was recorded by a similar operation. The surface lowering speed M continuously measured in a process similar to that of Example 1 was 0.05 to 0.20 mm/h.

Similarly to Example 1, the lifting speed P was changed on the basis of the M value, to control the crystal pulling speed V at a prescribed target value. In more concrete terms, V=0.05±0.005 mm/h. in constant control. The crystal rotational frequency was at a constant level of 100 rpm. Thus, it was possible to grow a shape-controlled Sm123 crystal having a shoulder portion of 2 mm in length and a body portion of 10 mm square having a length of 6 mm.

Example 3

A method of preparing an oxide crystal of $PrBa_2Cu_3O_{7-X}$ ($0 \leq X \leq 1$) (hereinafter referred to as Pr123) is now described.

Figure 5:
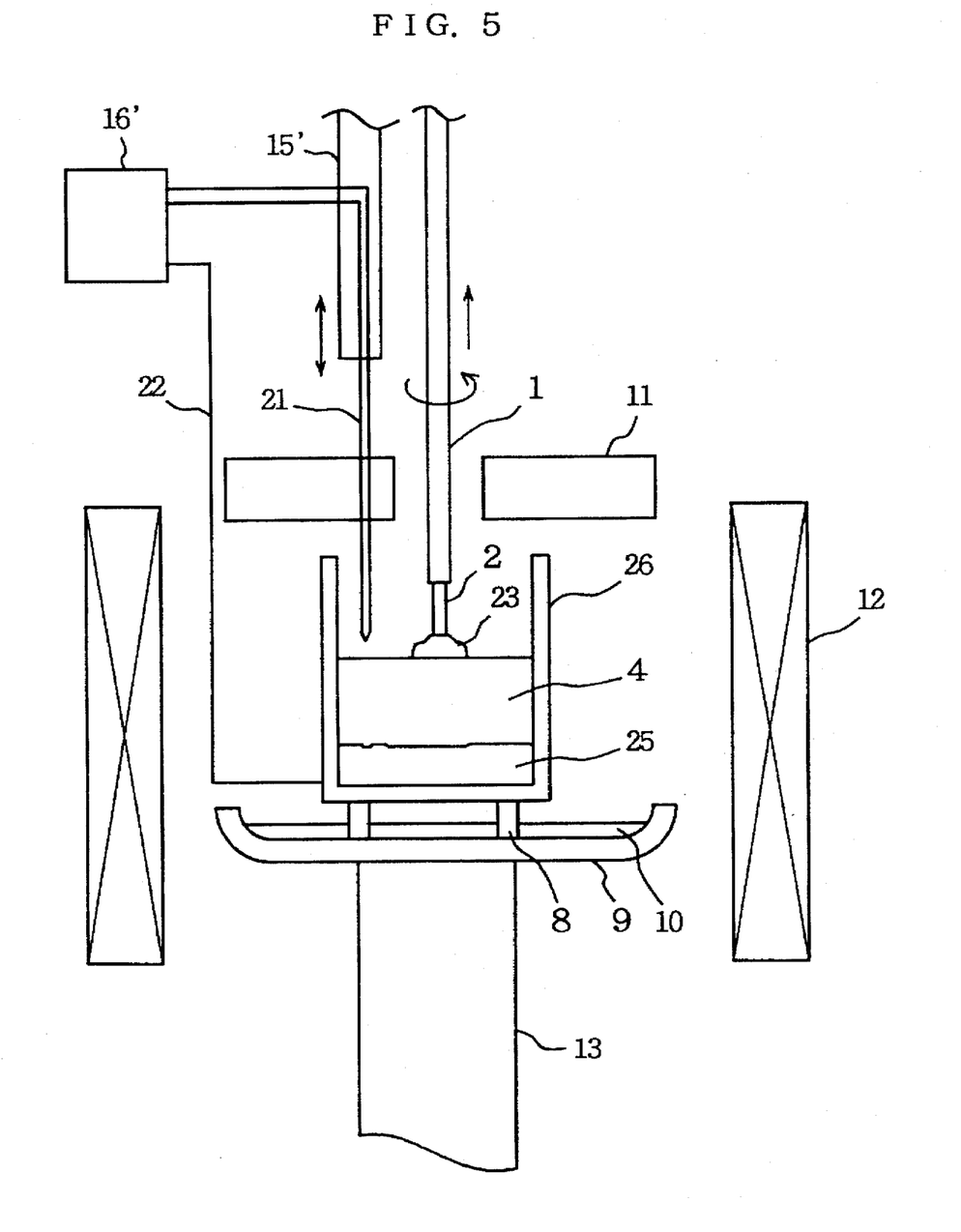
FIG. 5 is a model diagram of an apparatus employed for pulling a Pr123 crystal in Example 3.

FIG. 5 is a model diagram showing an apparatus employed for pulling a Pr123 crystal. This apparatus is different from that of Example 1 in the following points: This apparatus employs no double crucible. A crucible 26 consisting of an MgO sintered body is employed for storing a melt. An R-type platinum-rhodium thermocouple 21 is employed in place of the platinum wires. A platinum wire 22 is brought into close contact with the crucible 26. Electromotive force of the thermocouple 21 can be measured by a digital volt meter 16'. The thermocouple 21 is fixed not to a counter shaft, but to a manual Z stage 15'. A solid phase deposit 25 forming a melt consists of $PrBaO_3$ (hereinafter referred to as Pr110), so that a Pr123 crystal 23 is pulled.

According to Example 3, a Pr123 crystal was prepared in the following procedure: First, Pr110 was introduced into the bottom of the crucible 26 consisting of an MgO sintered body of 40 mm in inner diameter, 50 mm in outer diameter and 40 mm in depth. A substance prepared by mixing barium carbonate and copper oxide with each other so that Ba and Cu were in a molar ratio of 1:3 and temporarily sintering the mixture at 880° C. for 40 hours was introduced on Pr110 as a raw material for a BaO—CuO melt 4. A crucible support pole 8 consisting of an MgO single crystal was set up on an $Al_2O_3$ plate 9, Ag 10 was introduced into the plate 9, and the crucible 26 was placed on the support pole 8.

These were set in a furnace, and heated to about 1000° C. by a heater 12, to melt the raw material stored in the crucible. At this time, Ag 10 was sufficiently melted to form an Ag atmosphere around the crucible. On the other hand, Pr110 formed a solid phase deposit on the bottom of the crucible 26, while Pr, Ba and Cu in the melt were at molar ratios of about 1:40:120 since Pr was dissolved into the melt 4 from Pr110.

Then, the surface temperature of the melt was maintained at about 960° C. to 980° C., and a pulling shaft 1 which was provided with a seed crystal on its lower end was rotated at 120 rpm and slowly downwardly moved so that the lower end of the seed crystal was brought into contact with the melt surface.

The resistance across the thermocouple 21 and the platinum wire 22 and the thermoelectromotive force of the thermocouple 21 were measured with the digital volt meter 16', while the Z stage 15' was slowly downwardly moved. At this time, the measured resistance value was about 20 M$\Omega$. When the thermocouple 21 came into contact with the surface of the melt 4, the measured resistance was reduced to 100 to 300 k$\Omega$, while it was possible to measure the temperature of the melt surface from the thermoelectromotive force of the thermocouple 21. The current position $Z_0$ of the Z stage 15' was recorded, and then the Z stage 15' was lifted up to a prescribed height. After a lapse of a constant time T, a position $Z_1$ of the Z stage 15' corresponding to the current surface position was recorded by a similar operation. The surface lowering speed M continuously measured in a process similar to that of Example 1 was 0.01 to 0.06 mm/h.

Similarly to Example 1, the lifting speed P was changed on the basis of the M value, to control the crystal pulling speed V at a prescribed target value. In more concrete terms, V=0.05±0.005 mm/h. in constant control. The crystal rotational frequency was at a constant level of 120 rpm. With reference to the measured temperature value of the melt surface, further, the power of the heater was so controlled that the same was constant. Through the aforementioned process, it was possible to grow a shape-controlled Sm123 crystal having a shoulder portion of 2 mm in length and a body portion of 10 mm square having a length of 6 mm.

While platinum wires were employed in Examples 1, 2 and 3 as conductors to be brought into contact with the metal surfaces, various conductors can be employed so far as the same are conductive substances having low reactivity with the melts and stable shapes. While the rotational frequencies of the pulling shafts were 120, 100 and 120 rpm in Examples 1, 2 and 3 respectively, the present invention is not restricted to these but the rotational frequency may be set at an arbitrary value in a range of 5 to 200 rpm. Further, the seed crystal is not restricted to an MgO single crystal, but may be selected from various ones such as a Y123 single crystal, an Sm123 single crystal and a Pr123 single crystal which are worked in proper crystal plane orientations. Further, the heating means is not restricted to an electric resistance furnace, but may be prepared from another means such as high frequency heating means. The atmosphere in the furnace can be freely selected from a low oxygen partial pressure atmosphere and a low pressure atmosphere, in addition to the atmosphere.

According to the present invention, as hereinabove described, it is possible to accurately measure a melt lowering speed without exerting a bad influence on crystal growth in growth of the oxide crystal having a structure of $RBa_2Cu_3O_{7-X}$ (R: yttrium or lanthanoid element, $0 \leq X \leq 1$), thereby recognizing the crystal pulling speed. Thus, the crystal growth can be stably maintained over a long time, while the crystal diameter can be controlled on the basis of the crystal pulling speed. According to the present invention, it is possible to prepare a large oxide crystal of high quality whose crystal shape is accurately controlled.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing an oxide crystal comprising the steps of:

pulling a crystal of an oxide having a structure of $RBa_2Cu_3O_{7-X}$ (R: yttrium or lanthanoid element, $0 \leq x \leq 1$) from a raw material melt being stored in a crucible with a rotary crystal pulling shaft, measuring a surface position of said raw material melt with time during pulling of said crystal to obtain a movement speed of said surface in a direction being substantially parallel to the crystal pulling direction, and adjusting a lifting speed of said crystal pulling shaft by said movement speed.

2. The method of preparing an oxide crystal in accordance with claim 1, wherein said step of measuring said surface position and adjusting said lifting speed comprises the steps of:

setting a target value (V) of a crystal pulling speed to balance a crystal growth rate and said crystal pulling speed with each other, and setting said lifting speed (P) of said crystal pulling shaft in accordance with an equation of P=V−M after obtaining said movement speed (M) of said surface.

3. The method of preparing an oxide crystal in accordance with claim 1, wherein said step of measuring said surface position and adjusting said lifting speed comprises the steps of:

providing an electrically conductive material being capable of stably maintaining its shape upon contact with said raw material melt to be upwardly and downwardly movable, providing means for measuring an electric change being caused when said electrically conductive material is brought into contact with said raw material melt and connecting said electrically conductive material to said means, detecting a position ($Z_0$) of said surface of said raw material melt from said electric change being caused when said electrically conductive material is downwardly moved from a prescribed position and brought into contact with said raw material melt in crystal pulling, upwardly moving said electrically conductive material, being brought into contact with said raw material melt, for separating the former from the latter, and again downwardly moving said conductive material after a lapse of a prescribed time (T) from said detection of said $Z_0$ for bringing the same into contact with said raw material melt, thereby detecting a current position ($Z_1$) of said surface of said raw material melt from current said electric change, and obtaining ($Z_0-Z_1$)/T as said movement speed of said surface.

4. The method of preparing an oxide crystal in accordance with claim 3, wherein said means comprises an electric resistance measuring device, said electric resistance measuring device being connected with said electrically conductive material, for detecting said position of said surface of said raw material melt from a change of an electric resistance value caused when said conductive material comes into contact with said raw material melt.

5. The method of preparing an oxide crystal in accordance with claim 1, wherein said crucible comprises an inner crucible consisting essentially of an oxide of said R, and an outer crucible, holding said inner crucible therein, consisting essentially of magnesia, said crystal being pulled from said raw material melt being stored in said inner crucible.

* * * * *